United States Patent [19]

Yamazaki

[11] Patent Number: 5,601,883

[45] Date of Patent: *Feb. 11, 1997

[54] MICROWAVE ENHANCED CVD METHOD FOR COATING PLASTIC WITH CARBON FILMS

[75] Inventor: Shumpei Yamazaki, Tokyo, Japan

[73] Assignee: Semicondoctor Energy Laboratory Co., Inc., Kanagawa-ken, Japan

[*] Notice: The term of this patent shall not extend beyond the expiration date of Pat. No. 5,015,494.

[21] Appl. No.: 314,456

[22] Filed: Sep. 28, 1994

Related U.S. Application Data

[60] Continuation of Ser. No. 16,674, Feb. 11, 1993, abandoned, which is a division of Ser. No. 765,467, Sep. 26, 1991, abandoned, which is a continuation of Ser. No. 496,180, Mar. 20, 1990, abandoned, which is a continuation of Ser. No. 154,287, Feb. 10, 1988, abandoned.

[30] Foreign Application Priority Data

Feb. 10, 1987 [JP] Japan ................................ 62-28957

[51] Int. Cl.⁶ .......................... B05D 3/06; C23C 16/00
[52] U.S. Cl. .................. 427/577; 427/575; 427/571; 427/249; 427/122
[58] Field of Search ...................... 427/577, 575, 427/571, 249, 122; 423/446; 428/408

[56] References Cited

U.S. PATENT DOCUMENTS

| | | | |
|---|---|---|---|
| 2,721,154 | 10/1955 | Hopf et al. | 427/122 |
| 4,060,660 | 11/1977 | Carlson et al. | 428/408 |
| 4,104,441 | 8/1978 | Fedoseev et al. | 428/408 |
| 4,434,188 | 2/1984 | Kamo et al. | 427/575 |
| 4,504,519 | 3/1985 | Zelez | 428/408 |
| 4,524,106 | 6/1985 | Flasck | 428/408 |
| 4,582,727 | 4/1986 | Neelameggham et al. | 427/228 |
| 4,597,844 | 7/1986 | Hiraki et al. | 428/408 |
| 4,599,135 | 7/1986 | Tsunekawa et al. | 156/643 |
| 4,603,082 | 7/1986 | Zelez | 428/408 |
| 4,645,713 | 2/1987 | Shioya et al. | 427/39 |
| 4,698,256 | 10/1987 | Giglia et al. | 428/408 |
| 4,701,317 | 10/1987 | Arakawa et al. | 428/408 |
| 4,707,384 | 11/1987 | Schachner et al. | 428/408 |
| 4,715,937 | 12/1987 | Moslehi et al. | 427/573 |
| 4,725,345 | 2/1988 | Sakamoto et al. | 428/408 |
| 4,728,529 | 3/1988 | Etzkorn et al. | 427/577 |
| 4,732,761 | 3/1988 | Machida et al. | 427/577 |

(List continued on next page.)

FOREIGN PATENT DOCUMENTS

| | | |
|---|---|---|
| 60-33300 | 2/1985 | Japan . |
| 61-121859 | 6/1986 | Japan . |
| 62-123096 | 6/1987 | Japan . |

OTHER PUBLICATIONS

Matsuo, S. and M. Kivchi, "Low Temperature Chemical Vapor Deposition Method Utliizing an Electron Cyclotron Resonance Plasma". Japanese Journal of Applied Physics vol. 22, No. 4, Apr. 1983, pp. 210–212.

Kawarada et al, Jpn. J. Appl. Phys. vol. 26, No. 6, Jun. 1987, pp. L1032–L1034.

*Primary Examiner*—Roy V. King
*Attorney, Agent, or Firm*—Sixbey Friedman Leedom & Ferguson; Gerald J. Ferguson, Jr.; Thomas W. Cole

[57] ABSTRACT

A microwave enhanced chemical vapor deposition method is provided for coating plastic articles with crystalline carbon films. First, a reactive gas including hydrogen gas and a carbon containing raw material gas is introduced into a reaction chamber. Next, a magnetic field is established in the reaction chamber. Microwaves are next introduced into the chamber to create a cyclotron resonance in order to form a plasma of carbon and hydrogen containing gas. The carbon containing plasma deposits a coating of a crystalline and amorphous carbon on a substrate placed within the reaction chamber, while the hydrogen plasma simultaneously etches away the amorphous carbon, thereby leaving only crystalline carbon. The method is particularly adapted for the deposition of crystalline carbon films on plastic materials, as the substrate is not required to be heated in order to receive a layer of crystalline carbon.

15 Claims, 5 Drawing Sheets

U.S. PATENT DOCUMENTS

| | | | |
|---|---|---|---|
| 4,737,379 | 4/1988 | Hudgons et al. | 427/579 |
| 4,758,280 | 7/1988 | Bergmann et al. | 427/38 |
| 4,770,940 | 9/1988 | Ovshinsky et al. | 428/408 |
| 4,772,513 | 9/1988 | Sakamoto et al. | 428/408 |
| 4,777,090 | 10/1988 | Ovshinsky et al. | 428/408 |
| 4,809,876 | 3/1989 | Tomaswick et al. | 428/408 |
| 5,015,494 | 5/1991 | Yamazaki | 427/39 |

5,601,883

MICROWAVE ENHANCED CVD METHOD FOR COATING PLASTIC WITH CARBON FILMS

This application is a continuation of Ser. No. 08/016,674, filed Feb. 11, 1993, now abandoned; which itself is a divisional of Ser. No. 07/765,476, filed Sep. 26, 1991, now abandoned; which is a continuation of Ser. No. 07/496,180, filed Mar. 20, 1990, now abandoned; which is a continuation of Ser. No. 07/154,287, filed Feb. 10, 1988, now abandoned.

BACKGROUND OF THE INVENTION

This invention relates to a microwave enhanced CVD method for coating plastic articles a carbon film and its products.

Recently, ECR CVD has attracted the interests of researchers as a new method of manufacturing thin films, particularly amorphous thin films. For example, Matsuo et al discloses one type of such an ECR CVD apparatus in U.S. Pat. No. 4,401,054. This recent technique utilizes microwaves to energize a reactive gas into a plasma state by virtue of a magnetic field which functions to pinch the plasma gas within the excitation space. With this configuration, the reactive gas can absorb the energy of the microwaves. A substrate to be coated is located distant from the excitation space (resonating space) for preventing the same from being spattered. The energized gas is showered on the substrate from the resonating space. In order to establish an electron cyclotron resonance, the pressure in a resonating space is kept at $1 \times 10^{-3}$ to $1 \times 10^{-5}$ Torr at which electrons can be considered as independent particles and resonate with a microwave in an electron cyclotron resonance on a certain surface on which the magnetic field takes a particular strength required for ECR. The excited plasma is extracted from the resonating space, by means of a divergent magnetic field, to a deposition space which is located distant from the resonating space and in which is disposed a substrate to be coated.

In such a prior art method, it is very difficult to form a thin film of a polycrystalline or single-crystalline structure, so that currently available methods are almost limited to processes for manufacturing amorphous films which have lower hardness. Also, a high energy chemical vapor reaction is difficult to obtain in accordance with such prior art and therefore a diamond film or other carbon films having high melting points, or which are uniformly applied on uneven surface, such as exteriors of the parts of watchs, that have depressions and cavities can not be formed.

SUMMARY OF THE INVENTION

It is therefore an object of the invention to cover fragile items with hard carbon film by means of microwave enhanced CVD.

The carbon coating is implemented for several purposes. When the parts of gears or screws as mechanical components are coated, the carbon coating function to reinforce the strength of the components and endow the components with the resistance to abrasion. On the other hand, when ornaments, such as buttons, frames of spectacles and some parts of watches are coated, the carbon coatings become decorations.

According to one aspect of the invention, in addition to a carbon compound, nitrogen and/or a nitrogen compound gas is inputted to the reaction chamber. The inputted nitrogen functions to prevent lattice defects from growing by virtue of external or internal stress. When a boron compound is also inputted together with the nitrogen compound, the adhesivity of carbon deposited is improved. Boron nitride appears to be the binder between the carbon and the underlying substrate to be coated such as parts of watch. Preferably, carbon and boron nitride are deposited on the substrate in the form of crystalline grain particles or a layer containing nitrogen and boron at less than 10%.

According to another aspect of the invention, a new CVD process has been culminated. The new process utilizes a mixed cyclotron resonance which was introduced firstly by the inventors. In the new type of exciting process, a sonic action of reactive gas itself must be taken into consideration as a non-negligible perturbation besides the interaction between respective particles of the reactive gas and magnetic field and microwave, and therefore charged particles of a reactive gas can be absorbed in a relatively wide resonating space. Preferably, the pressure is maintained higher than 3 Torr. For the mixed resonance, the pressure in a reaction chamber is elevated $10^2$–$10^5$ times as high as that of prior art. For example, the mixed resonance can be established by increasing the pressure after ECR takes place at a low pressure. Namely, first a plasma gas is placed in ECR condition at $1 \times 10^{-3}$ to $1 \times 10^{-5}$ Torr by inputting microwave under the existence of magnetic field. Then a reactive gas is inputted into the plasma gas so that the pressure is elevated to 0.1 to 300 Torr and the resonance is changed from ECR to MCR (Mixed Cyclotron Resonance). The MCR appears together with the whistler mode. Carbon can be decomposed and undergo a necessary reaction at only such a comparatively high pressure. In this process, diamond is likely to grow selectively on convexities.

Although carbon is deposited also in an amorphous phase along with the preferred diamond, hydrogen in a plasma state eliminates amorphous carbon by etching, leaving crystalline carbon.

It has been found that the hardness of the diamond formed by the present invention is 1.3 to 3.0 times as high as that of diamond which has been made by prior art vapor phase method. In what follows, the term, "film," is used in a broad meaning. If a number of diamond particles are finely distributed on a surface, we call such a diamond coating as a "film." Of course, a uniform and continuous amorphous layer is called a "film."

When a number of plastic gear-wheels are coated with diamond film, e.g., 1–10 micron thick in accordance with the present invention, a new kind of gear-wheel is realized which is characterized by a low weight, a high wear resistance, a smooth surface and a low price. These advantages are present also when ball bearings are manufactured by coating plastic spheres with a carbon film according to the invention.

When the parts of a wrist watch are coated with carbon film, such parts can be made of plastics and aluminum or its alloys which are easily processed so that the wrist watch is strong and lightweight weighted. In particular, the electric field tends to be concentrated at the corners of the parts during process, and therefore such corners particularly exposed to external impacts when used can be coated with a carbon film thicker than that on a flat surface by a factor of two.

DETAILED DESCRIPTION OF THE PREFERRED EMBODIMENTS

Figure 1:
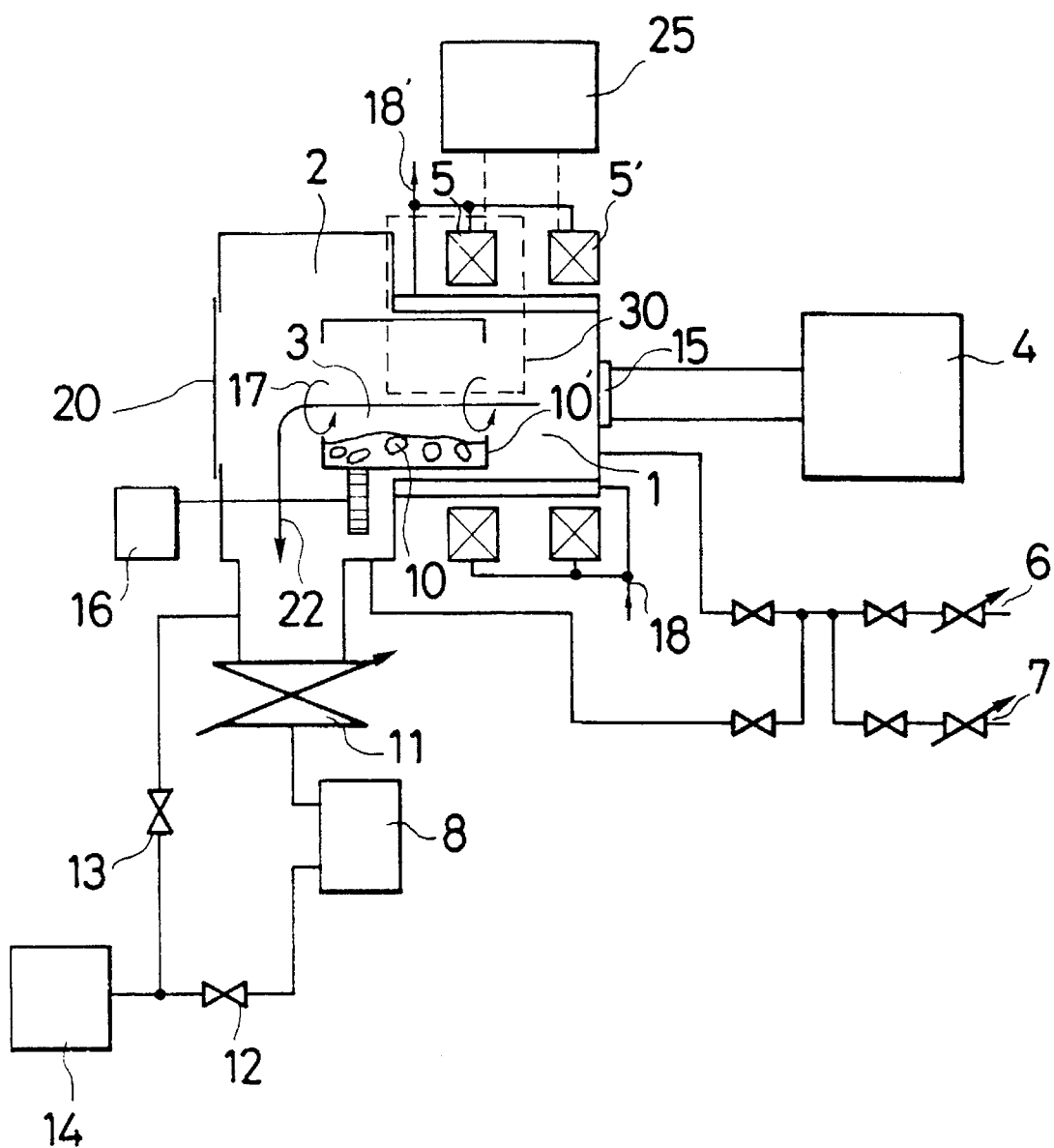
FIG. 1 is a cross section view showing a CVD apparatus for coating plastic objects in accordance with the present invention.

Referring to FIG. 1, an embodiment of the invention is illustrated. In the figure, the apparatus comprises a reaction chamber in which a plasma generating space 1 and an auxiliary space 2 are defined and which can be held at an appropriate pressure, a microwave generator 4, electromagnets 5 and 5' which are supplied with an electric power from a power supply 25, and a water cooling system 18. The plasma generating space 1 has a circular cross section. In the plasma generating space 1, a hollow cylinder 10' having inward-turned brims is rotatably supported in the space so that a microwave emitted from the microwave generator 4 passes through the cylinder along its axis. The cylinder 10' is made of a stainless steel or a quartz and turned by means of a motor 16 through a gear. Provided for evacuating the reaction chamber is a evacuating system comprising a turbo molecular pump 8 and a rotary pump 14 which are connected with the reaction chamber through pressure controlling valves 11, 12 and 13. The process with this apparatus is carried out as follow.

Objects 10 to be coated with carbon film are plastics such as gear-wheels with 3–10 mm in diameter and 0.2–2.0 mm in thickness, screws, buttons, toy parts which need sufficient hardlesses, frames of spectacles, the entire external surface of ball pens, propelling pencils and the like, or other ornaments having various external shapes which are to be coated with diamond, or parts of watchs such as frames made of plastics, windows made of glasses or plastics. The objects 10 are put in the cylinder 10' which is to turn at 0.1–10 rpm during process. At the same time, the objects 10 are heated to a certain elevated temperature at which the objects are not damaged. For plastic objects, the elevated temperature is, e.g., 150°–300° C.; for aluminium or its alloy objects, e.g., 400°–700° C.; for iron, stainless steel or other metallic objects, e.g., 700°–1000° C. As the temperature elevates, the hardness of the coating becomes high and the proportion of diamond increases. The cylinder 10', although the means is not illustrated in the figure, is shaken by micro-vibration of 100 Hz–10 KHz. By the turning and the vibration, the surfaces of the objects exposed to the reactive gas are always switching during process. The reaction chamber is evacuated by the turbo molecular pump 8 and the rotary pump to $1\times10^{-6}$ Torr or lower. Then, argon, helium or hydrogen as a non-productive gas is introduced to the reaction chamber from a gas introducing system 6 at 30 SCCM, and a microwave of 2.45 GHz is emitted from the microwave generator at 500 W through a microwave introduction window 15 to the plasma generating space 1 which is subjected to a magnetic field of about 2K Gauss induced by the magnets 5 and 5'. The pressure of the non-productive gas is $1\times10^{-4}$ Torr. A plasma is generated in the space 1 at a high density by the energy of the microwave. The surfaces of the objects 10 are cleaned by high energy electrons and non-productive atoms, in addition to the introduction of non-productive gas, $C_2H_2$, $C_2H_4$ and/or $CH_4$ are introduced at 200 SCCM through a introduction system 7. At the same time, a large amount of hydrogen is introduced into the reaction chamber so that the carbon compound gas is diluted with the hydrogen to 0.1–2.0%. The pressure of the reaction chamber is maintained at 0.1–300 Torr, preferably 3–30 Torr, e.g., 10 Torr. By virtue of the comparatively high pressure, the product can be deposited at a high speed and spread over widely, in the chamber. The reactive gas is excited by the energy of microwave in the same manner as carried out with the non-productive gas explained in the foregoing description. As a result of a mixed resonance, carbon is deposited in the form of a diamond film or an i-carbon (insulated carbon consisting of crystalline particles) film on the objects 10.

Figure 2A:
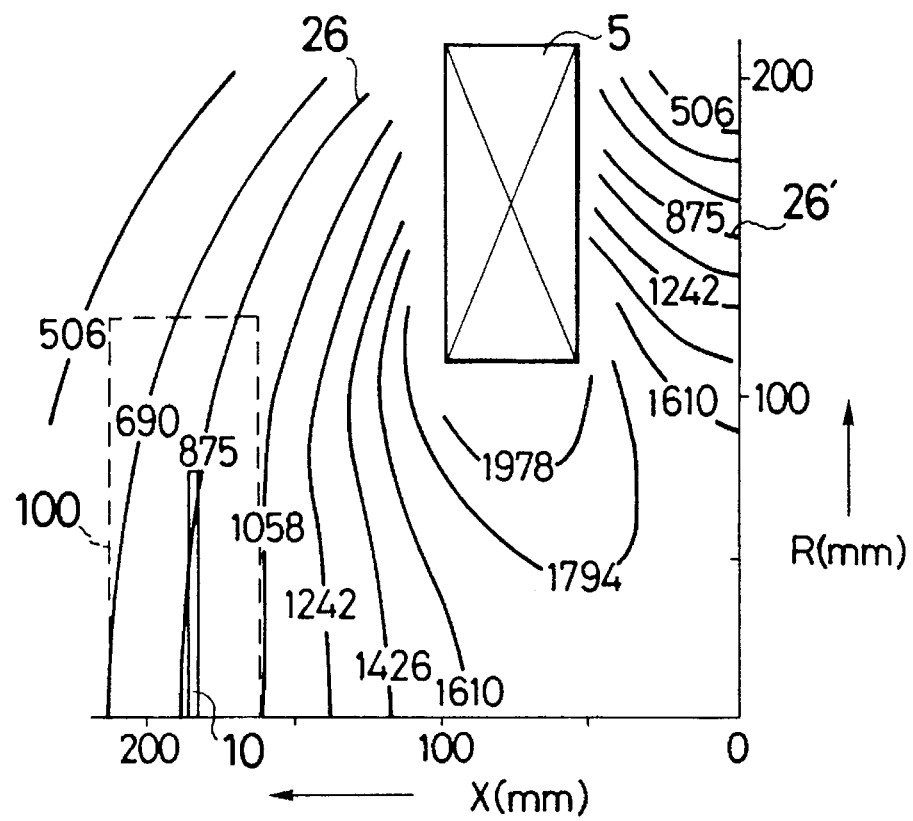
FIG. 2(A) is a graph showing the profile of the equipotential surfaces of magnetic field in cross section in accordance with a computer simulation.
Figure 2B:
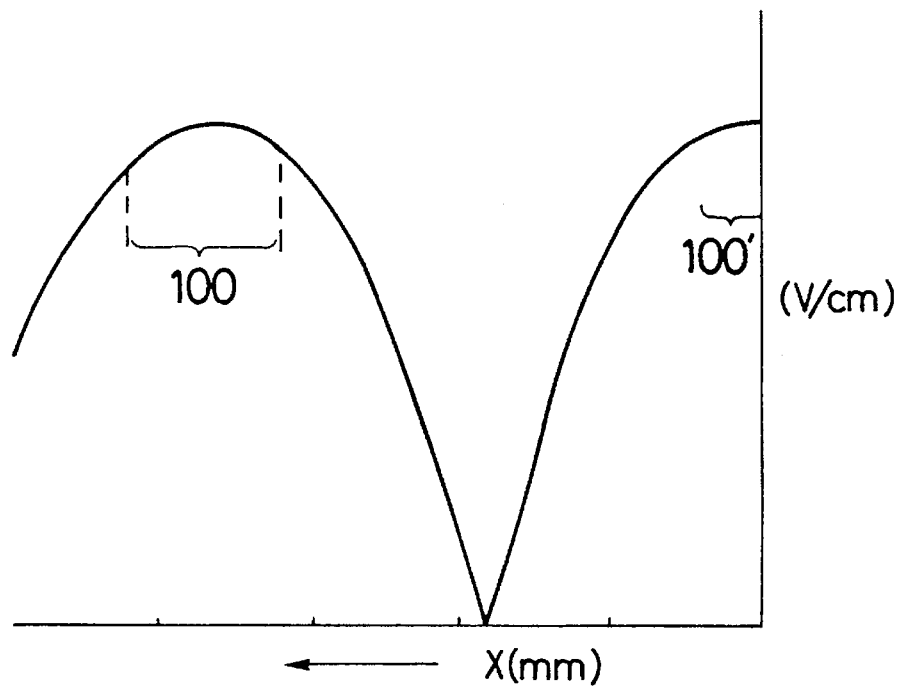
FIG. 2(B) is a graphical diagram showing the strength of electric field in accordance with a computer simulation.
Figure 3A:
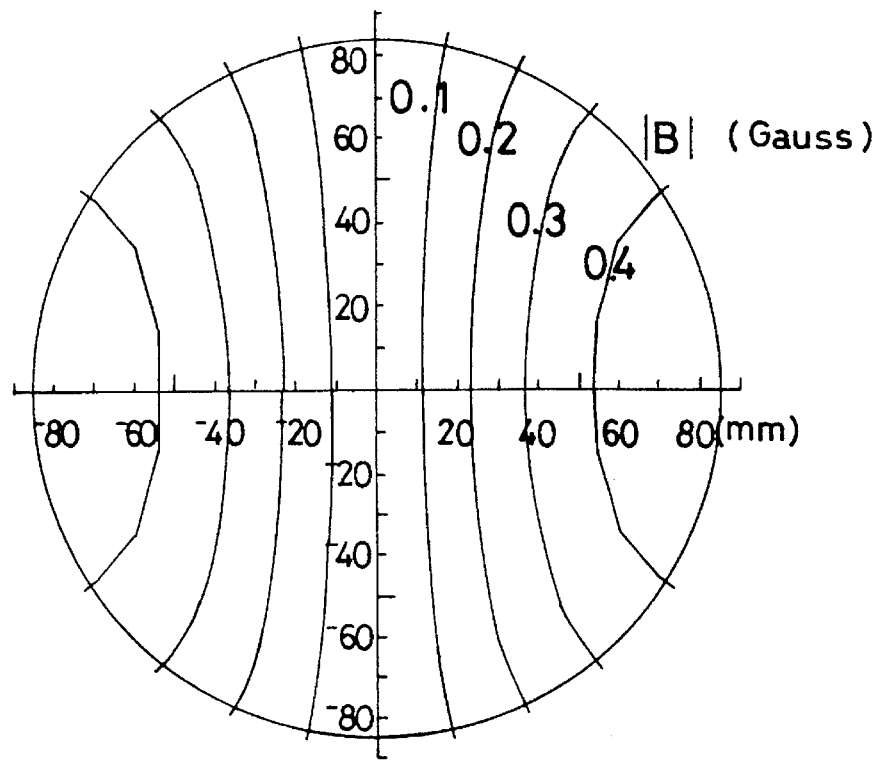
FIGS. 3(A) and 3(B) are graphical diagrams showing equipotential surfaces in terms of magnetic field and electric field of microwave propagating in a resonating space respectively.
Figure 3B:
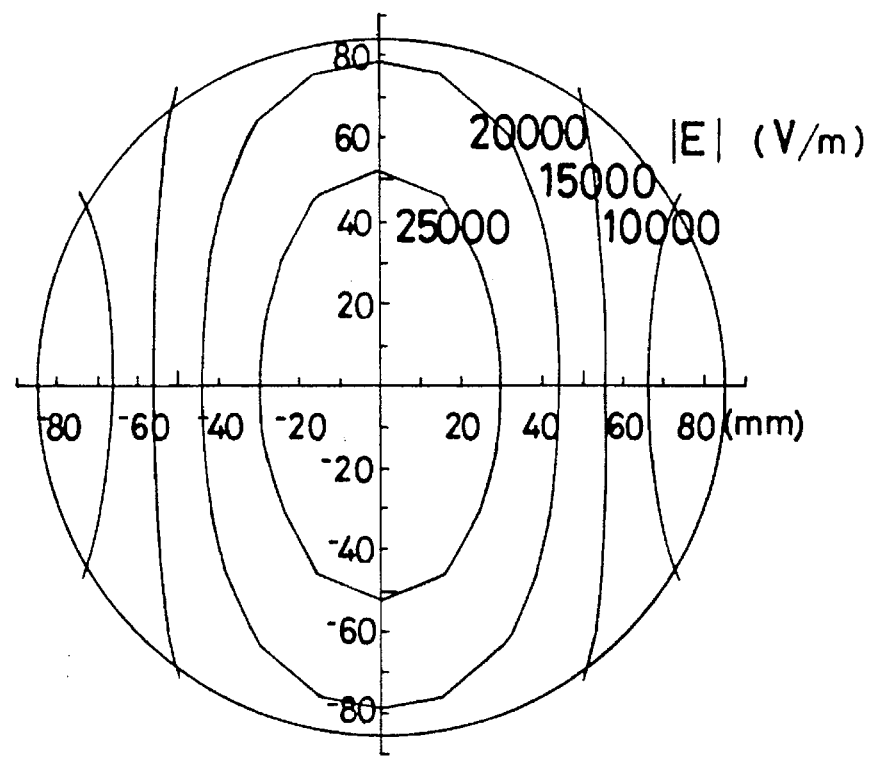

FIG. 2(A) is a graphical diagram showing the distribution of magnetic field on the region 30 in FIG. 1. Curves on the diagram are plotted along equipotential surfaces and given numerals indicating the strengths on the respective curves of the magnetic field induced by the magnets 5 and 5' having a power of 2000 Gauss. By adjusting the power of the magnets 5 and 5', the strength of the magnetic field can be controlled so that the magnetic field becomes largely uniform over the surface to be coated which is located in the region 100 where the magnetic field (875±185 Gauss) and the electric field interact. In the diagram, reference 26 designates the equipotential surface of 875 Gauss at which ECR (electron cyclotron resonance) condition between the magnetic field and the frequency of the microwave is satisfied. Of course, in accordance with the present invention, ECR can not be established due to the high pressure in the reaction chamber, but instead a mixed cyclotron resonance (MCR) takes place in a broad region including the equipotential surface of the ECR condition. FIG. 2(B) is a graphical diagram of which the X-axis corresponds to that of FIG. 2(A) and shows the strength of electric field of the microwave in the plasma generating space 1. The strength of the electric field takes its maximum value in the regions 100 and 100'. However, in the region 100', it is difficult to heat the substrate 10' without disturbing the propagation of the microwave. In other regions a film is not uniformly deposited, but deposited the product in the form of a doughnut. It is for this reason that the substrate 10 is disposed in the region 100. The plasma flows in the lateral direction. According to the experimental, a uniform film can be formed on a circular substrate having a diameter of up to 100 mm. Preferably, a film is formed in the chamber on a circular substrate having a diameter of up to 50 mm with a uniform thickness and a uniform quality. When a larger substrate is desired to be coated, the diameter of the space 1 can be sized double with respect to the vertical direction of Fig. 2(A) by making use of 1.225 GHz as the frequency of the microwave. FIGS. 3(A) and 3(B) are graphical diagrams showing the distributions of the magnetic field and the electric field due to microwave emitted from the microwave generator 4 on a cross section of the plasma generating space 1. The curves in the circles of the figures are plotted along equipotential sure, faces and given numerals showing the strength. As shown in FIG. 3(B), the electric field reaches its maximum value at 25 KV/m.

The diffraction images of films formed in accordance with the present invention were obtained. As a result, halo patterns were observed together with spots indicating the existence of diamond. When the film was deposited at a substrate temperature as low as 350° C., a halo pattern which is indicative of an amorphous structure was observed. On the other hand, clear spots indicating the existence of diamond appeared on the diffraction pattern of the film deposited at a substrate temperature 800° C. or higher. When the film was deposited at an intermediate temperature, the carbon film became i-carbon film which is the mixture of amorphous carbon and micro-crystalline carbon. Further, the films were deposited at 150°–350° C. by virtue of different input powers. When the power of microwave inputted was 1.0 KW, a halo pattern and spots due to the existence of diamond were simultaneously observed indicating an i-carbon structure. The halo patterns gradually disappeared as the microwave power elevates, and when the power reaches a high level not lower than 1.5 KW the film became rich in diamond structure. In this experiment, the carbon films contain hydrogen at 1–30 atomic %. Still further, the films were deposited at 700° C. by virtue of different input powers. As the microwave power elevated from 500 W, the halo pattern gradually disappeared, and when the power reached 700 W or higher, diamond structure prevailed in the film.

The pressure in the reaction chamber is chosen at a value compatible with an ECR condition, so that a preliminary plasma discharge takes place. While the discharge continues, the pressure is changed to 1 Torr to $3\times10^3$ Torr where a mixed resonance takes place with a plasma of which particles have a mean free path of 0.05 mm to several millimeters, normally not more than 1 mm.

Next, another deposition method in accordance with the present invention will be described. The deposition apparatus used for the preceding embodiment can be used also for this embodiment.

A number of objects 10 such as plastic gear components are placed in the cylinder 10', and the reaction chamber is evacuated to $1\times10^{-6}$ Torr or a higher vacuum condition. Then, hydrogen gas is introduced from a gas introducing system 6 at 30 SCCM, and a microwave of 500 Watt at 2.45 GHz is emitted from the microwave generator 4 through a microwave introduction window 15 to the plasma generating space 1 which is subjected to a magnetic field of about 2K Gauss induced by the magnets 5 and 5'. The hydrogen is excited into a high density plasma state in the space 1 at $1\times10^{-4}$ Torr by the energy of the microwave. The surfaces of the objects 10 are cleaned by high energy electrons and hydrogen atoms. In addition to the introduction of the hydrogen gas, a carbon compound gas as the productive gas such as $C_2H_2$, $C_2H_4$, $CH_3OH$, $C_2H_5OH$ or $CH_4$ are inputted at 30 SCCM through an introduction system 7. In this process, the productive gas is diluted with hydrogen at a sufficiently thin density, e.g., 0.1 to 5%. Further in addition to this, a nitrogen or its compound gas, such as ammonia or nitrogen gas, is inputted to the reaction chamber from the introduction system. The proportion of the nitrogen compound gas to the carbon compound gas is 0.1%–5%. Then, the pressure in the reaction chamber is maintained at 0.1 Torr 300 Torr, preferably 3–30 Torr, e.g., 1 Torr. By increasing this pressure in the reaction chamber, it is possible to make high the density of the productive gas and, therefore, faster the growth tale of the product. Namely, carbon atoms are excited in a high energy condition so that the objects 10 disposed in the cylinder 10' is coated with carbon in the form of a film made of i-carbon or diamond having 0.1 to 100 microns in grain diameter. The deposited carbon contains nitrogen at 0.01–1 weight %.

Next, a further embodiment will be described. Objects 10 are disposed in the cylinder 10', and the reaction chamber is evacuated to $1\times10^{-6}$ Torr or a higher vacuum condition. Then, hydrogen gas is introduced from a gas introducing system 6 at 300 SCCM, and a microwave of 1 Kilo Watt at 2.45 GHz is emitted from the microwave generator 4 through a microwave introduction window 15 to the plasma generating space 1 which is subjected to an magnetic field of about 2K Gauss induced by the magnets 5 and 5'. The hydrogen is excited into a high density plasma state in the space 1 by the energy of the microwave. The surfaces of the objects 10 are cleaned by high energy electrons and hydrogen atoms. In addition to the introduction of the hydrogen gas, a carbon compound gas as the productive gas such as $C_2H_2$, $C_2H_4$, $CH_3OH$, $C_2H_5OH$ or $CH_4$ is inputted at 3 SCCM through an introduction system 7. In this process, the productive gas is diluted with hydrogen at a sufficiently thin density, e.g., 0.1 to 15%. Further in addition to this, a nitrogen compound gas such as ammonia, $NO_2$, NO, $N_2$ or nitrogen gas, and $B_2H_6$ or $BF_3$ are inputted to the reaction chamber from the introduction systems 7 and 8 respectively at B/N=1. The proportion of $B_2H_6(BF_3)+NH_3$ to the carbon compound gas is 1%–50%. Then, the pressure in the reaction chamber is maintained at 1 Torr–760 Torr, preferably higher than 10 Torr or 10–100 Torr, e.g., 30 Torr. By increasing this pressure in the reaction chamber, it is possible to make high the density of the productive gas and, therefore, faster the growth rate of the product. Namely, the objects 10 disposed in the cylinder 10' are coated with carbon containing nitrogen and boron (or in the form of boron nitride). The product includes carbon and boron nitride as the main components, the sum of whose proportions is at least 90%.

On the electron beam diffraction image of the thin film produced in accordance with the above procedure, observed are spots indicating the presence of polycrystalline boron nitride and crystal carbon, i.e., diamond (single-crystalline particles). Namely, the film is made of the mixture of boron nitride and diamond. As the microwave power is increased from 1 KW to 5 KW, the proportion of diamond in the film increases.

When $BF_3$ and/or $NF_3$ is used as the boron and/or nitrogen source, the plasma gas contains fluorine which fluorine functions to eliminate impurity residing on the surface to be coated by etching.

For reference, a film formation process was performed in the same manner as in the above but without using a magnetic field. As a result, a graphite film was deposited.

By a similar process, amorphous or microcrystalline film can also be deposited by appropriately selecting the deposition conditions. An amorphous film is deposited when carbon compound gas is diluted with the larger amount of hydrogen gas, when the input power is comparatively small and when the process temperature is comparatively low.

It is a significant feature of the invention that the carbon formed in accordance with the invention has a very high hardness irrespective of whether the carbon is amorphous or crystalline. The Vickers hardness is 4500–6400 Kg/mm$^2$, e.g., 5000 Kg/mm$^2$. The thermal conductivity is not lower than 2.5 W/cm deg, e.g., 5.0–6.6 W/cm deg.

Figure 4:
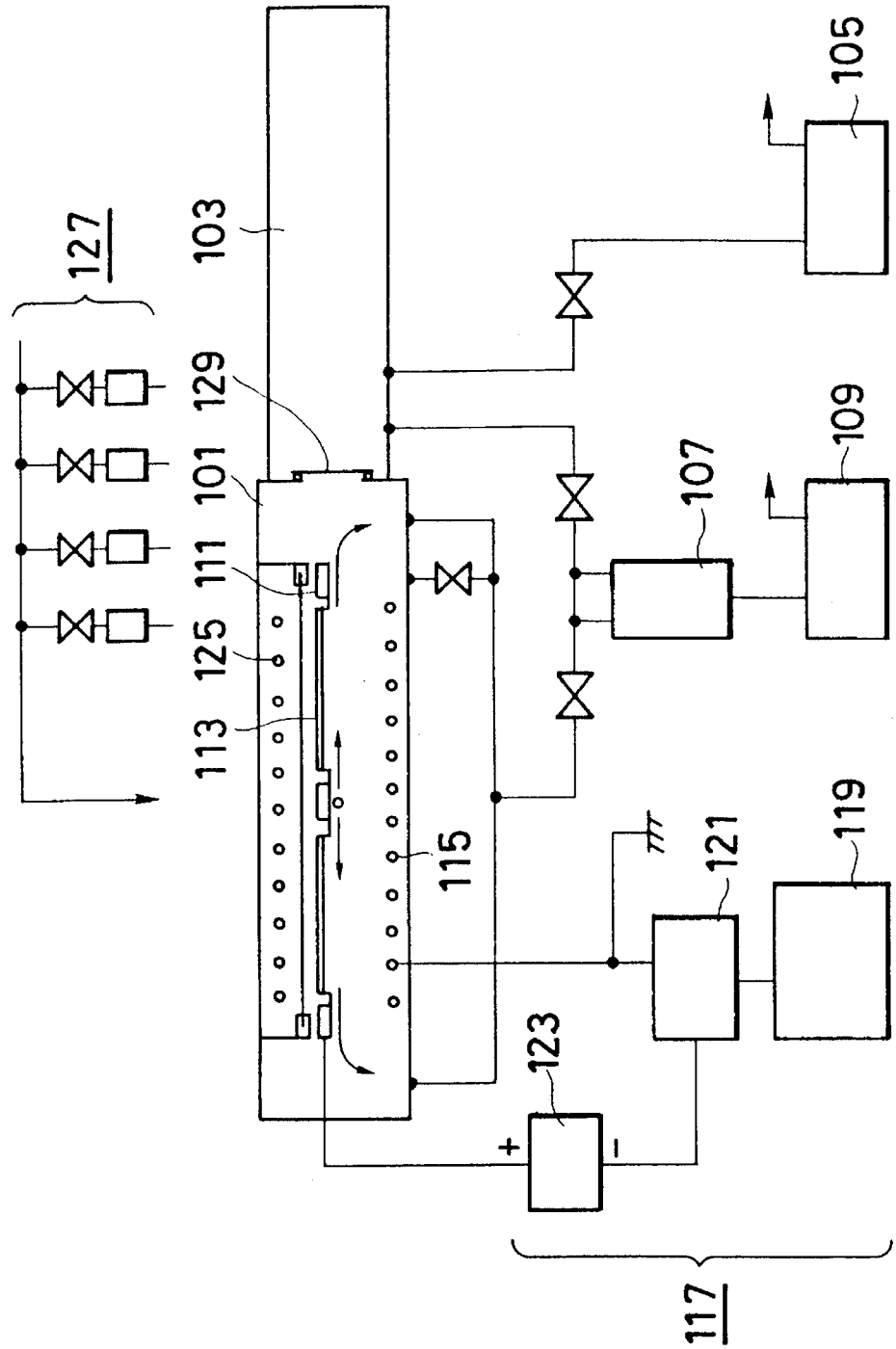
FIG. 4 is a cross sectional view of another CVD apparatus for forming a carbon film in accordance with the present invention.

The present invention can be applied for the formation of carbon by means of glow or arc discharge enhanced CVD caused by an r.f. power. FIG. 4 is a cross sectional view showing a CVD apparatus for deposition by virtue of an r.f. power. In the figure, the apparatus comprises a reaction chamber 101, a loading chamber 103, a rotary pump 105 for evacuating the loading chamber 103, a turbo molecular pump 107 associated with a rotary pump 109 for evacuating both the reaction chamber 101 and the loading chamber 103, a gas feeding system 127 for inputting process gas such as reactive gas or dopant gas through a nozzle 129, a substrate holder 111 for supporting objects 113, electrodes 115 disposed opposite to the holder 111, an RF power supply 117 consisting of a radiofrequency power source 119 associated with a matching circuit 121 and a DC bias circuit 123 for supply an r.f. power between the electrodes 115 and the substrate holder 111, and a halogen lamp heater 125 with a quartz window 129 for heating the objects 113. The deposition process for coating the objects 113 with a carbon film is as follow.

After disposing the objects 113 in the reaction chamber 101 through a gate 129, a reactive gas composed of a gaseous carbon compound such as $CH_4$, $C_2H_4$ and $C_2H_2$, and a dopant gas such as nitrogen, a nitrogen compound gas and a boron compound gas if necessary were inputted to the reaction chamber at $1 \times 10^{-3}$ to $5 \times 10^{-1}$ Torr. The carbon compound gas was diluted with hydrogen at 50 mol %. At the same time, the objects 113 were heated to not higher than 450° C. by means of the heater 125. In this condition, a vapor reaction was initiated by means of r.f. power inputted from the power supply 117. The r.f. power was 50 W to 1 KW (0.03 to 3.00 W/cm$^2$) at 13.56 MHz superimposed on an DC bias voltage of −200 V to +400 V. Then, carbon films were deposited on the objects 113 at a growth rate of 150 Å/min. The carbon film looked like an amorphous structure rather than a crystalline structure. Despite the amorphous structure, the hardness was measured as high as that of a diamond film. The Vickers hardness thereof was 4500–6400 Kg/mm$^2$, e.g., 5000 Kg/mm$^2$. So we call it "diamond-like carbon" or DLC for short.

Figure 5:
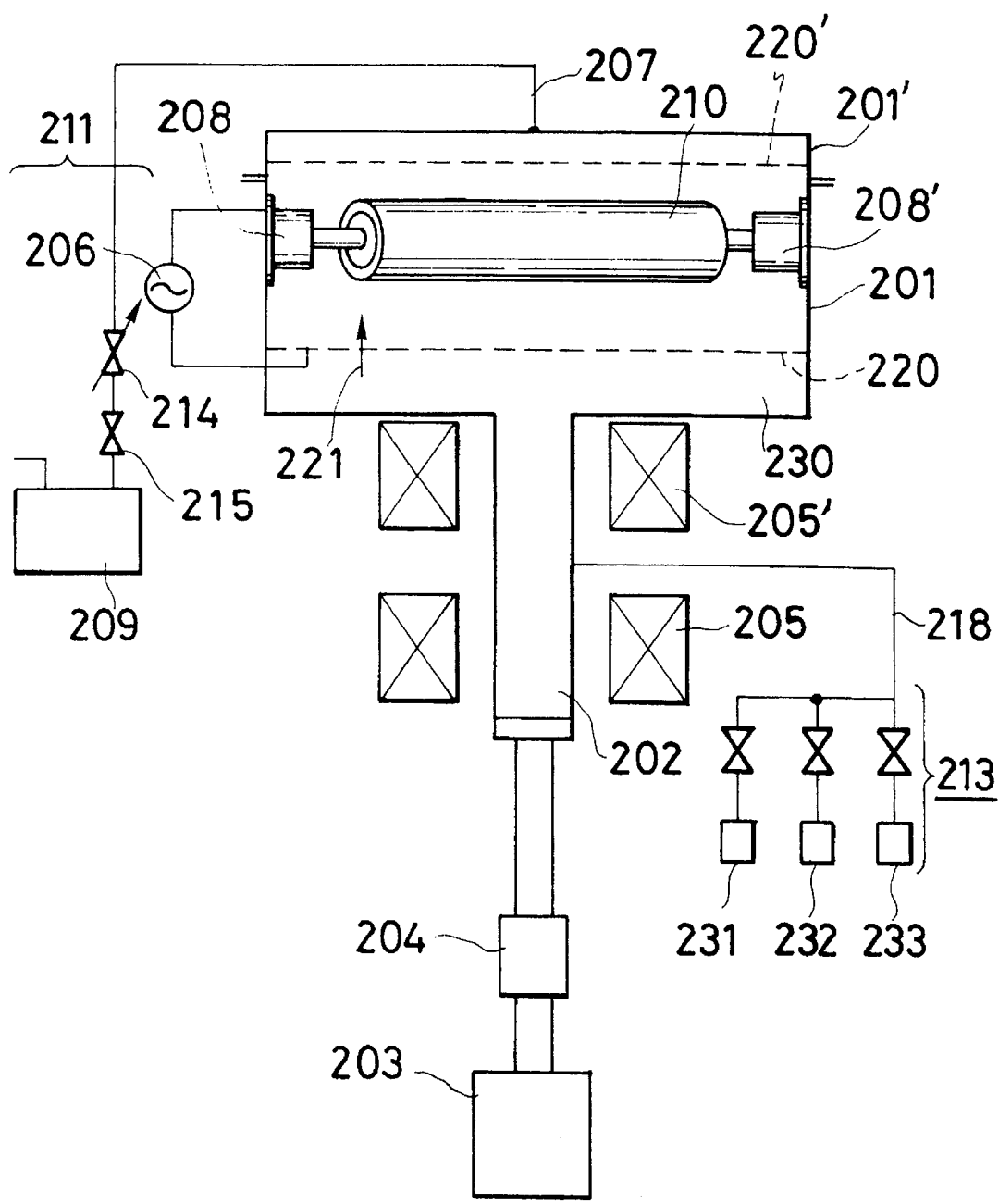
FIG. 5 is a cross sectional view showing a further CVD apparatus for forming a carbon film in accordance with the invention.

Referring to FIG. 5, a still further embodiment will be described. In this embodiment, a photosensitive printing drum is formed by means of plasma CVD suitable for carbon film deposition. Generally speaking, the photosensitive material forming photodetecting layer is organic photoconductor (OPC) which suffers from a high temperature higher than 200° C. Examples of such organic conductors are poly-N-vinyl-carvazole (PVC), tri-nitrofluorlene (TNF) and so forth. To form a barrier layer, the OPC layer is coaned with an organic insulating film such as polyethylene, polycarbonate, polyurethane, barilene and so forth. The organic insulating film in turn is coated with a carbon film according to the invention which has a high hardness and a surface smoothness, and can be formed adhesively at a relative low temperature. Between the OPC film and the underlying metallic substrate may be disposed a p or n type silicon semiconductor layer, if necessary.

In the figure, a stainless steel container 201 is provided with a lid 201' and forms a reaction space therein. A substrate 210 in the form of a cylinder made of Al, Cr, Mo, Au, Ir, Nr, V, Ti, Pd and Pt is disposed in the space. The substrate 210 has been coated with a resin barrier film on the external surface. A pair of holders 208 and 208' is provided on the opposed side wall of the container 201 to support and rotate the substrate 201 around its axis. On the lid 1' is provided a homogenizer of a meshed electrode 220' through which exhausted gas is removed by an exhaustion system 11 comprising a pump 209 and valves 214 and 215. Opposite to the lid 1' formed is a resonating space 202 which is subjected to the magnetic field induced by an electromagnet 205 and 205'. A microwave oscillator 203 is connected with the opposed end of the resonating space 202 with an associated matching apparatus 204. The power source is a high frequency power supply 206 including a DC power source connected between the holders 208 and 208' and the meshed electrode 220 which functions as a homogenizer. The power inputted to the reaction space is for example an electric field induced by 13.56 MHz voltage biased by a DC voltage applied between the holders and the meshed electrode. The substrate surface is oriented perpendicular to the electric field in the figure. The container 201 may be provided with a means for moving the substrate in the axial direction during the axial rotation if the substrate is somewhat long. Also a plurality of substrates may be treated at once by providing a plurality of pairs of holders arranged in the normal direction to the drawing sheet. The homogenizer helps the reactive gas to spread over a wide area in the reaction space.

A reactive gas consisting of methane and diborane or phosphine (as a dopant) diluted with hydrogen is inputted to the reaction space through the introduction system 213. For example, methane/hydrogen =1/1; the input power =50 W to 1 KW (0.03 to 3 W/cm$^2$ in terms of plasma electric field). If no DC bias is applied to, the abundance of hydrogen in a produced carbon is increased and the optical energy gap is 2.5 to 3.5 eV. If a positive potential is given to the holders relative to the electrode 220, hydrogen ions are repulsed and therefore the energy gap decreases resulting in a band gas of 1.0 to 2.0 eV.

The substrate temperature is chosen between −100° to +200° C., preferably −100° to +150° C., so that no damage appears to the underlying resin layer whose thermal resistivity is not so high.

Furthermore, when the r active gas is pre-excited in advance of entering the reaction space, the deposition speed is 500 to 1000 Å/min. In absence of the pre-excitation, the deposition speed remains as low as 100 to 200 Å/min.

The thickness of the carbon film on the substrate is 0.1 to 4 micron, preferably 0.5 to 2 micron with a wider energy gap, and eventually a barrier layer having good abrasion-proof characteristic is obtained.

The Vickers hardness of the carbon coating formed in accordance with the embodiment is not lower than 2000 Kg/mm$^2$ and the thermal conductivity is not lower than 2.5 W/cm deg, whereby the life time of the copying machine employing the coating is improved so that copying is possible more than two hundreds thousands times without wear of the drum. Below are experiments of this embodiment.

1) First Experiment

The reaction pressure was 0.1 Torr. Hydrogen and methane were introduced respectively at 200 SCCM. Microwave was inputted to the resonating space at 2.45 GHz and at 30 W to 1.3 KW, e.g., 500 W. The strength of magnetic field in the resonating space was 875 Gauss. The electric power was inputted to the reaction space at 13.56 MHz and at 500 W. Although the substrate was not heated intentionally, the temperature was elevated to 150° C. in light of plasma.

As a result, the deposition speed of amorphous carbon was 30 Å/sec during the deposition time of 15 minutes The speed was 20 times higher than that obtained by plasma CVD, i.e. 1.5 Å/sec. The amorphous carbon film has 2300 Kg/mm$^2$ in Vickers hardness, $10^{10}$ ohm cm in resistivity and 1.8 eV in optical energy gap.

When the mixture of hydrogen and ethylene or acetylene was used in place of methane the deposition speed was further, improved.

2) Second Experiment

A carbon film was deposited on the surface of a photosensitive drum made aluminum coated with an OPC film with 25 cm in diameter and 30 cm in length, in the same way as the first experiment except the specified in what follow.

The electric power was inputted to the reaction space at 300 W biased by +200 V. The pressure in the reaction space was 0.3 Torr. A 0.4 micron thick carbon film was deposited at 200 Å/min.

3) Third Experiment

A deposition was made in the same manner as the second experiment making use of the whistler mode in high frequency CVD and the condition in what follow. The whistler mode is discussed in J. Musil and F. Zachek;. Plasma Physics Vol.17 pp.735–739 (1974).

The substrate was shuttled in the axial direction and cooled to −30° C. during process. The DC bias is +400 V. As a result, a 0.5 micron thick carbon film was formed.

300 samples of films were prepared in accordance with this experiment and employed in copying machines to be examined for reliability. After being subjected 100 times to the cycle of room temperature →150° C.→ room temperature, no sample degrades the contrast of a duplicated image and causes peeling.

When a metallic squeegee coated with a carbon film was employed for a copying machine to prevent papers from being involved around the turning drum, any portion of the film did not appear coming off even after $10^5$ to $10^6$ times copying. This result is excellent when compared with the life of machines with existing drums capable of only $1 \times 10^4$ to $7 \times 10^4$ times copying.

In accordance with the present invention, a super lattice structure can be also formed. A boron nitride (BN) thin film is deposited in the same way as illustrated in the above but without using carbon compound gas. A carbon thin film and a BN thin film are deposited in turn many times so that a super lattice structure is attached on a substrate.

The invention should not limited to the above particular embodiments and many modifications and variations may cause to those skilled in the art. For example, it has been proved effective to add aluminium or phosphorous into carbon at 0.001 to 1 weight %.

I claim:

1. A plasma processing method comprising the steps of:

introducing a reactive gas comprising hydrogen gas and a carbon containing raw material gas into a reaction chamber introducing a microwave into said chamber;

establishing a magnetic field in said reaction chamber;

causing a cyclotron resonance by said microwave and said magnetic field within said reaction chamber thereby forming a plasma of carbon and hydrogen containing gas; and treating a substrate with said plasma, wherein said substrate is not intentionally heated during the treating of said substrate with said plasma and wherein a combination of crystalline and amorphous carbon is formed on a surface of said substrate while an etching step is simultaneously performed on said amorphous carbon by hydrogen plasma during the treating of said substrate with the plasma to leave only crystalline carbon on said substrate.

2. The method of claim 1 wherein said substrate has a surface made of an organic material.

3. The method of claim 2 wherein said organic material is an organic photosensitive material.

4. The method of claim 1 wherein a temperature of said substrate is maintained at −100° to 200° C.

5. A plasma processing method comprising the steps of:

introducing a reactive gas comprising a carbon containing raw material gas and hydrogen gas into a reaction chamber, causing a cyclotron resonance by introducing a microwave and a magnetic field with said reactive chamber to form a plasma of carbon and hydrogen containing gas, and treating a substrate with said plasma, wherein said substrate is cooled during said treating and a combination of crystalline and amorphous carbon material from said raw material gas is formed on a surface of said substrate while an etching step is simultaneously performed on said amorphous carbon material by said hydrogen plasma during the treating of said substrate with the plasma to leave only crystalline carbon on said substrate.

6. The method of claim 5 wherein said substrate has a surface made of an organic material.

7. The method of claim 6 wherein said organic material is an organic photosensitive material.

8. The method of claim 5 wherein a temperature of said substrate is maintained at −100° to 200° C.

9. The method of claim 5 wherein a temperature of said substrate is maintained at −100° to 0° C.

10. The method of claims 5 wherein a temperature of said substrate is maintained at 100° C.–200° C.

11. A plasma processing method comprising the steps of:

introducing a reactive gas including a carbon containing raw material gas and hydrogen gas into a reaction chamber;

introducing a microwave into said reaction chamber;

establishing a magnetic field in said reaction chamber;

causing a cyclotron resonance by said microwave and said magnetic field within said reaction chamber thereby forming a plasma of said carbon and hydrogen containing gas;

placing an object to be treated with plasma at or in the vicinity of said portion where the cyclotron resonance occurs; and performing a plasma treatment on said object with the plasma of said reactive gas, wherein a combination of crystalline and amorphous carbon material from the plasma of said raw material gas is formed on a surface of said object while an etching step is simultaneously performed on said amorphous carbon material by the plasma of said hydrogen during said plasma treatment.

12. The method of claim 11 wherein the strength of the magnetic field at the surface of said object is ±21.2% of that required for causing said cyclotron resonance.

13. A plasma processing method comprising the steps of:

locating an object in a reaction chamber;

introducing a reactive gas comprising a raw material gas and an etchant gas into said reaction chamber;

establishing a magnetic field within said reaction chamber;

apply microwave radiation to said raw material gas in order to cause a cyclotron resonance by the interaction of said magnetic field and said RF power to thereby form a plasma of raw material gas and etchant gas; and treating said object with plasma, wherein a deposition of material from the plasma of said raw material gas is formed on a surface of said object while an etching step is simultaneously performed on said material by said etchant gas during the treating of said object with the plasma.

14. A plasma processing method comprising the steps of:
locating an object with a reaction chamber;
introducing a reactive gas comprising a raw material gas and an etchant gas into said reaction chamber;
introducing a magnetic field in said chamber;
inputting a microwave into said reaction chamber in order to create a cyclotron resonance between said magnetic field and said microwave to convert said reactive gas to a raw material gas plasma and an etchant gas plasma;
treating said object with said plasma, wherein a deposition of material from said material gas plasma is formed on a surface of said object while an etching step is simultaneously performed on said material by said etchant gas plasma during the treating of said object with the plasma.

15. The method of claim 14 wherein the reactive gas includes hydrogen and carbon, and said deposition material is a combination of crystalline and amorphous carbon and hydrogen plasma created by said microwave etches away said amorphous carbon.

* * * * *